US012648300B2

(12) United States Patent
Cheng et al.

(10) Patent No.: US 12,648,300 B2
(45) Date of Patent: Jun. 2, 2026

(54) DISPLAY PANEL AND DISPLAY APPARATUS

(71) Applicant: Yungu (Gu'an) Technology Co., Ltd., Langfang (CN)

(72) Inventors: Feiyue Cheng, Langfang (CN); Yadong Huang, Langfang (CN); Panlong Zhang, Langfang (CN); Zhanjie Ma, Langfang (CN)

(73) Assignee: Yungu (Gu'an) Technology Co., Ltd., Langfang (CN)

( * ) Notice: Subject to any disclaimer, the term of this patent is extended or adjusted under 35 U.S.C. 154(b) by 551 days.

(21) Appl. No.: 18/146,819

(22) Filed: Dec. 27, 2022

(65) Prior Publication Data

US 2023/0133588 A1     May 4, 2023

Related U.S. Application Data

(63) Continuation of application No. PCT/CN2021/108702, filed on Jul. 27, 2021.

(30) Foreign Application Priority Data

Oct. 30, 2020     (CN) .......................... 202011194057.1

(51) Int. Cl.
| | |
|---|---|
| *H10K 59/121* | (2023.01) |
| *H10K 59/131* | (2023.01) |
| *H10K 59/60* | (2023.01) |

(52) U.S. Cl.
CPC ....... *H10K 59/1213* (2023.02); *H10K 59/131* (2023.02); *H10K 59/60* (2023.02)

(58) Field of Classification Search
CPC .. H10K 59/1213; H10K 59/131; H10K 59/60; H10K 59/12; G09G 3/3208
See application file for complete search history.

(56) References Cited

U.S. PATENT DOCUMENTS

| | | | |
|---|---|---|---|
| 11,282,900 B2 * | 3/2022 | An ....................... | G09G 3/3225 |
| 2009/0140270 A1 | 6/2009 | Takahashi et al. | |

(Continued)

FOREIGN PATENT DOCUMENTS

| | | |
|---|---|---|
| CN | 101826520 A | 9/2010 |
| CN | 106710525 A | 5/2017 |

(Continued)

OTHER PUBLICATIONS

Notice of Grant issued on Jan. 11, 2023, in corresponding Chinese Application No. 202011194057.1, 8 pages.

(Continued)

*Primary Examiner* — Chad M Dicke
*Assistant Examiner* — Gary Abel
(74) *Attorney, Agent, or Firm* — Maier & Maier, PLLC

(57) ABSTRACT

A display panel and a display apparatus. The display panel includes: a substrate including a first non-display area and a display area arranged around the first non-display area; and a plurality of pixel circuits arranged in a plurality of rows in the display area, each row of the pixel circuits includes a (Continued)

plurality of pixel circuits arranged in the first direction, the plurality of rows of the pixel circuits are arranged in the second direction, the second direction intersects the first direction, each of the pixel circuits includes a semiconductor layer for forming an active layer of a transistor, in which the semiconductor layers of adjacent ones of the pixel circuits are spaced apart from each other.

20 Claims, 7 Drawing Sheets

(56)                References Cited

U.S. PATENT DOCUMENTS

| | | | |
|---|---|---|---|
| 2010/0053042 A1 | 3/2010 | Kajiyama et al. | |
| 2015/0325594 A1* | 11/2015 | Yamashita | H10D 86/60 |
| | | | 257/72 |
| 2016/0155792 A1 | 6/2016 | Wang et al. | |
| 2017/0301286 A1* | 10/2017 | Xiang | G09G 3/3233 |
| 2019/0267440 A1* | 8/2019 | Park | G09G 3/3233 |
| 2019/0288051 A1* | 9/2019 | Choi | H10K 59/1213 |
| 2020/0104000 A1 | 4/2020 | Wang et al. | |
| 2020/0168686 A1 | 5/2020 | Han et al. | |
| 2020/0381506 A1* | 12/2020 | Kang | H10K 59/131 |
| 2021/0090501 A1* | 3/2021 | Wu | H10K 59/131 |
| 2021/0265437 A1* | 8/2021 | Son | H10D 86/441 |
| 2022/0173200 A1* | 6/2022 | Ueno | H05B 33/02 |
| 2024/0349554 A1* | 10/2024 | Shang | H10K 59/131 |

FOREIGN PATENT DOCUMENTS

| | | |
|---|---|---|
| CN | 107221549 A | 9/2017 |
| CN | 108010920 A | 5/2018 |
| CN | 108227263 A | 6/2018 |
| CN | 108807375 A | 11/2018 |
| CN | 109003573 A | 12/2018 |
| CN | 110930883 A | 3/2020 |
| CN | 111292687 A | 6/2020 |
| CN | 112234092 A | 1/2021 |
| JP | 2001100657 A | 4/2001 |
| JP | 2009169339 A | 7/2009 |

OTHER PUBLICATIONS

International Search Report issued on Nov. 3, 2021, in corresponding application No. PCT/CN2021/108702; 6 pgs.
The First Office Action for Chinese Application No. 202011194057.1, dated Mar. 3, 2022, 15 pages.
The Second Office Action for Chinese Application No. 202011194057.1, dated Aug. 3, 2022, 13 pages.

* cited by examiner

DISPLAY PANEL AND DISPLAY APPARATUS

CROSS REFERENCE TO RELATED APPLICATION

The present application is a continuation of International Application No. PCT/CN2021/108702 filed on Jul. 27, 2021, which claims the benefit of priority to Chinese Patent Application No. 202011194057.1 filed on Oct. 30, 2020, both of which are incorporated herein by reference in their entireties.

TECHNICAL FIELD

The present application relates to the field of display, and particularly, to a display panel and a display apparatus.

BACKGROUND

With the continuous development of display technology, demands of users for functionality of electronic devices including a display panel are greater and greater. For example, in an electronic device such as a mobile phone and a tablet computer, functional modules such as a front camera, an infrared photosensitive element need to be integrated at a same side of the display panel.

In the prior art, the display panel may include a non-display area surrounded by a display area, and the functional modules such a front camera, an infrared photosensitive element may be integrated in the non-display area, so that the functional modules and the display panel can be compactly integrated in the electronic device. Nonetheless, in the above display panel, uneven display brightness usually occurs in different areas of the display panel.

SUMMARY

The present application provides a display panel and a display apparatus, which can alleviate the uneven display brightness of the display panel.

In a first aspect, the embodiments of the present application provides a display panel, comprising: a substrate comprising a first non-display area and a display area arranged around the first non-display area; and a plurality of pixel circuits arranged in a plurality of rows along a first direction and a plurality of columns along a second direction in the display area, the first direction and the second direction intersecting each other, and each of the pixel circuits comprising a semiconductor layer for forming an active layer of a transistor, wherein the semiconductor layers of adjacent ones of the pixel circuits are spaced apart from each other.

According to the display panel of the embodiments of the present application, the semiconductor layers of the adjacent pixel circuits are spaced apart from each other, that is, the semiconductor layers of the adjacent pixel circuits are not only disconnected from each other in a first direction, but also disconnected from each other in a second direction. Compared with the existing display panel in which the semiconductor layers of the adjacent pixel circuits are interconnected as a semiconductor layer unit, the display panel of the embodiments of the present application is not subjected to the effect of the first non-display area on the length of the semiconductor layer unit, and the lengths of the semiconductor layers to which the pixel circuits are connected tend to be the same. Therefore, the regional characteristic difference of transistors caused by the length difference of the semiconductor layers is reduced, the characteristics of the transistors of a same function in the pixel circuits in the display area tend to be the same, the brightness uniformity of the displayed image in the display area is improved, and the possibility of uneven display brightness is reduced.

On the one hand, it has been proved that the interconnecting structures arranged in the layers in which the preset signal lines are located and in the conductive layers located at a side of the preset signal lines away from the substrate can significantly alleviate the regional characteristic difference of transistors, thereby significantly improving the display brightness uniformity. On the other hand, by arranging the interconnecting structures in the conductive layers located at the side of the preset signal lines away from the substrate, the wiring pressure of the conductive layers in which the preset signal lines are located due to the arrangement of interconnecting structures and the preset signal lines in a same layer can be alleviated, and the wiring rationality of the display panel is improved.

In a second aspect, the embodiments of the present application provide a display apparatus comprising the display panel according to any one of the above embodiments of the first aspect of the present application.

DETAILED DESCRIPTION

Features and exemplary embodiments of various aspects of the present application will be described in detail below. In order to make the purpose, technical solutions and advantages of the present application clearer, the present application will be further described in detail below with reference to the accompanying drawings and specific embodiments.

Figure 1:
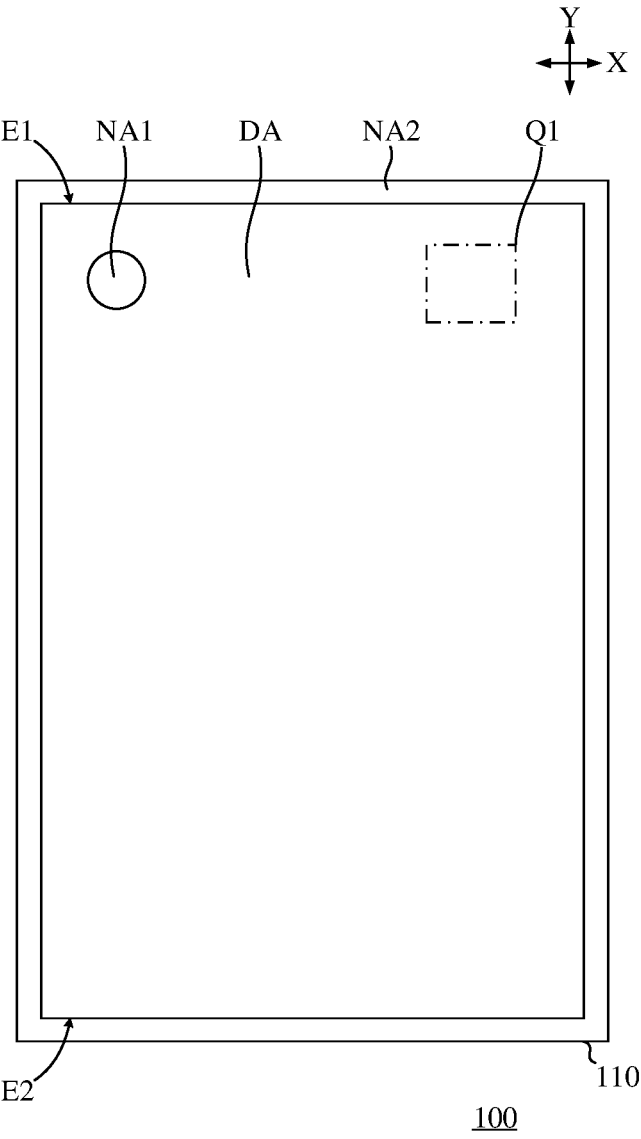
FIG. 1 shows a top view of a display panel according to a first embodiment of the present application.
Figure 2:
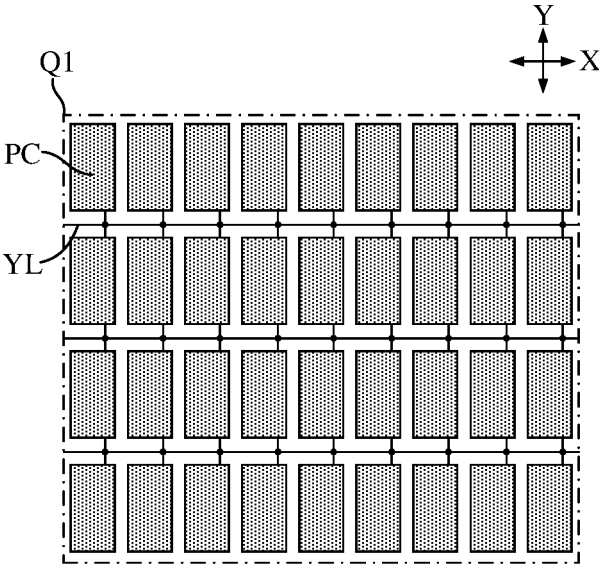
FIG. 2 shows a partial enlarged schematic diagram of the area Q1 in FIG. 1.

Referring to FIGS. 1 and 2, the display panel 100 includes a substrate 110 and a plurality of pixel circuits PC.

The substrate 110 may be rigid, such as a glass substrate, or flexible, such as a substrate including a polyimide (PI) layer. The substrate 110 includes a first non-display area NA1 and a display area DA arranged around the first non-display area NA1. In some optional embodiments, the substrate 110 further includes a second non-display area NA2 arranged around the display area DA and the first non-display area NA1. Optionally, the display panel may configure the display area DA as an area that can display images and configure the first non-display area NA1 as a light-transmitting area, so as to integrate photosensitive components at a side of the first non-display area NA1 to realize the corresponding photosensitive function. In the embodiment, for example, the first non-display area NA1 is, but not limited to, circular, and alternatively, its shape may be an ellipse, a polygon or the like.

The plurality of pixel circuits PC are arranged in a plurality of rows along a first direction X and a plurality of columns along a second direction Y in the display area DA, and the first direction X and the second direction Y intersect each other. That is, the plurality of pixel circuits PC are arranged in a plurality of rows in the display area DA, and each row of the pixel circuits PC includes a plurality of pixel circuits PC arranged in the first direction X. The plurality of rows of the pixel circuits PC are arranged along the second direction Y. The second direction Y intersects the first direction X. Herein, the pixel circuit refers to a set of circuit structures for driving corresponding light-emitting elements to emit light, which may include transistors and capacitors configured in a preset connection relationship.

Figure 3:
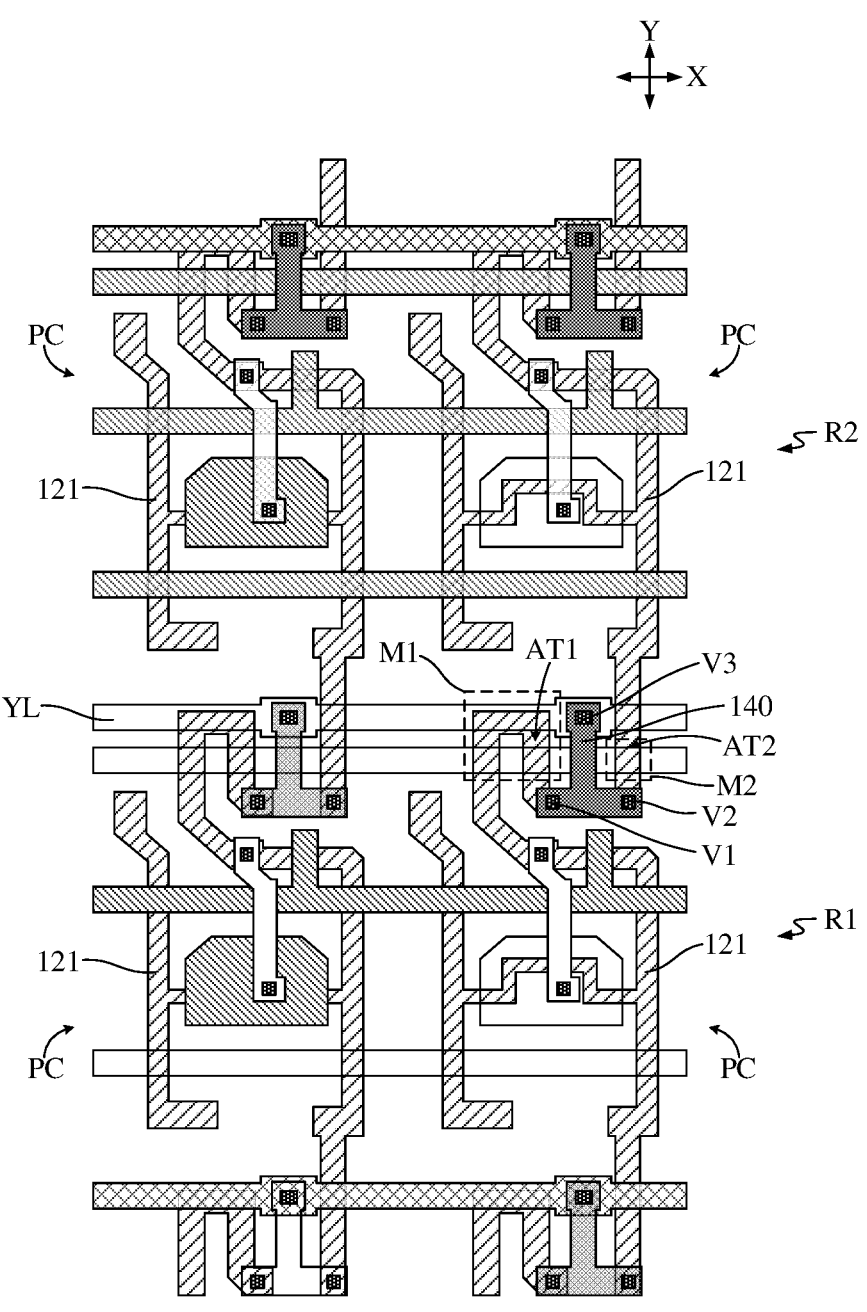
FIG. 3 shows a schematic structural diagram of a pixel circuit in a local area in a display panel according to a first embodiment of the present application.

FIG. 3 generally shows two rows of the pixel circuits PC, and each row of the pixel circuits PC illustrates two adjacent pixel circuits PC. FIG. 3 shows a part of the structure of the pixel circuit PC, and the rest of the structure is omitted. Each of the pixel circuits PC includes a semiconductor layer 121 for forming an active layer of a transistor.

Figure 4:
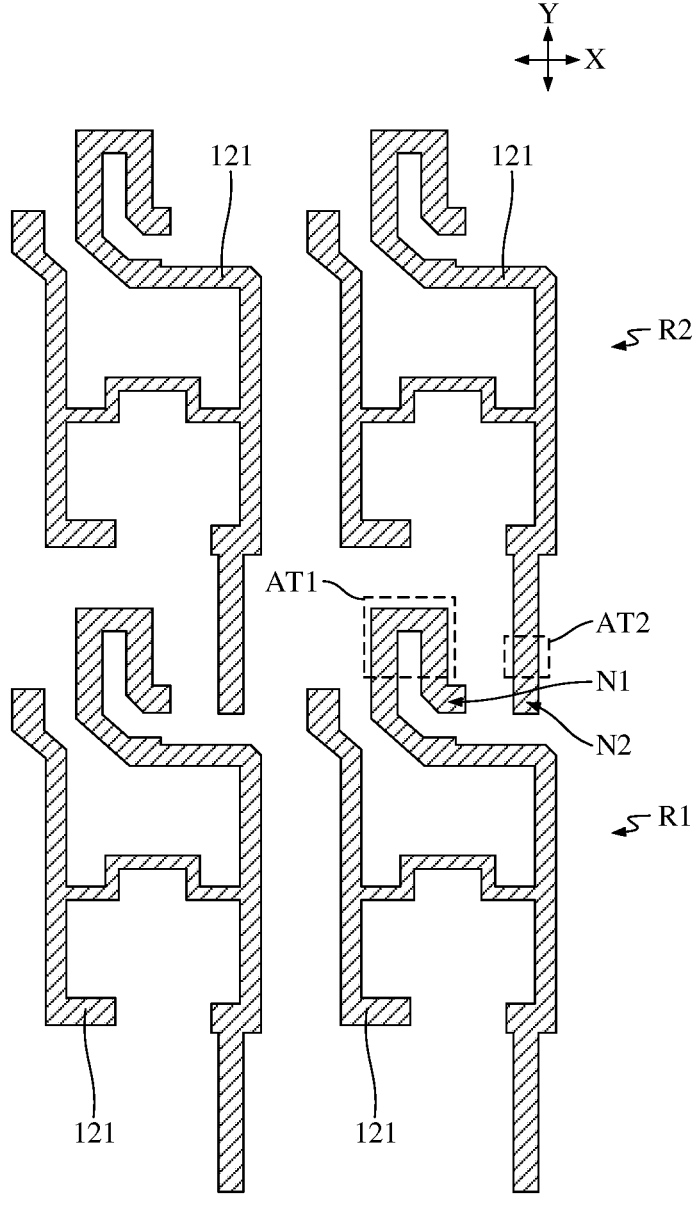
FIG. 4 shows a schematic structural diagram of a semiconductor layer of a pixel circuit in a local area in a display panel according to a first embodiment of the present application.

FIG. 4 generally shows the semiconductor layers 121 of two rows of the pixel circuits PC, and each row of the pixel circuits PC illustrates the semiconductor layers 121 of two adjacent pixel circuits PC. In the embodiment, the semiconductor layers 121 of adjacent ones of the pixel circuits PC are spaced apart from each other.

The semiconductor layer 121 may be a silicon semiconductor layer, such as a polycrystalline silicon (p-Si) layer. In the embodiment, the semiconductor layer 121 is a Low Temperature Poly-Silicon (LTPS) layer. The semiconductor layer 121 is not limited to the above materials and may be other silicon semiconductor layers such as single crystal silicon or an oxide semiconductor layer such as indium gallium zinc oxide (IGZO).

According to the display panel 100 of the embodiments of the present application, the semiconductor layers 121 of the adjacent pixel circuits PC are spaced apart from each other, that is, the semiconductor layers 121 of the adjacent pixel circuits PC are not only disconnected from each other in a first direction X, but also disconnected from each other in a second direction Y. Compared with the other display panels in which the semiconductor layers 121 of the adjacent pixel circuits PC are interconnected as a semiconductor layer unit, the display panel 100 of the embodiments of the present application is not subjected to the effect of the first non-display area NA1 on the length of the semiconductor layer unit, and the lengths of the semiconductor layers 121 to which the pixel circuits PC are connected tend to be the same. Therefore, the regional characteristic difference of transistors caused by the length difference of the semiconductor layers 121 is reduced, the characteristics of the transistors of a same function in the pixel circuits PC in the display area DA tend to be the same, the brightness uniformity of the displayed image in the display area DA is improved, and the possibility of uneven display brightness is reduced.

As shown in FIG. 1, the display area DA includes a first boundary E1 and a second boundary E2 opposite to each other in the second direction Y, and a spacing between the first non-display area NA1 and the first boundary E1 is not equal to a spacing between the first non-display area NA1 and the second boundary E2, for example, the spacing between the first non-display area NA1 and the first boundary E1 is less than the spacing between the first non-display area NA1 and the second boundary E2. In the display panel of the related art, the semiconductor layers 121 of the pixel circuits PC adjacent to each other in the second direction Y are interconnected as a semiconductor layer unit, that is, the semiconductor layers 121 of each column of the pixel circuits PC are interconnected as a semiconductor layers unit. Nonetheless, in the display panel of the related art, the lengths of the semiconductor layer units at two sides of the first non-display area NA1 in the second direction Y are different and are also different from the lengths of the semiconductor layer units in other areas of the display area DA, thus the display panel of the related art has regional characteristic difference of transistors, resulting in uneven display brightness. According to the display panel 100 of the above embodiments of the present application, even if the first non-display area NA1 is not centrally arranged in the display panel 100, the regional characteristic difference of transistors can be avoided, and it can be guaranteed that the display area DA has high brightness uniformity.

Optionally, as shown in FIGS. 2 and 3, the display panel 100 further includes a plurality of preset signal lines YL extending along the first direction X and arranged in the second direction Y. Each of the preset signal lines YL is electrically connected to the semiconductor layers 121 of corresponding adjacent two rows of the pixel circuits PC to simultaneously provide a preset signal to the adjacent two rows of the pixel circuits PC.

As shown in FIGS. 3 and 4, the adjacent two rows of the pixel circuits PC electrically connected to the preset signal line YL are denoted as one row R1 and the other row R2. In the adjacent two rows of the pixel circuits PC electrically connected to the preset signal line YL, the semiconductor layers 121 of one row R1 of the adjacent two rows of the pixel circuits PC include a first node N1 to which the preset signal line YL is electrically connected, the semiconductor layers 121 of the other row R2 of the adjacent two rows of the pixel circuits PC include a second node N2 to which the preset signal line YL is electrically connected, and in the second direction Y, the semiconductor layers 121 of adjacent ones of the pixel circuits PC are spaced apart from each other between the first node N1 and the second node N2.

Optionally, the preset signal lines YL are reference voltage lines configured to provide a reference voltage signal Vref for resetting a preset node of the pixel circuits PC.

Figure 5:
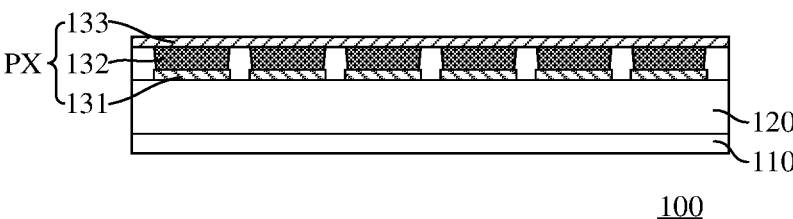
FIG. 5 shows a cross-sectional view of a display panel according to a first embodiment of the present application.

FIG. 5 shows a cross-sectional view of a display panel according to a first embodiment of the present application. Optionally, the display panel 100 further includes a plurality of light-emitting elements PX arranged in the display area DA. As shown in FIG. 5, the display panel 100 includes a driving array layer 120 on the substrate 110, and the plurality of light-emitting elements PX are arranged on the driving array layer 120. The plurality of light-emitting elements PX are arranged at a side of the driving array layer 120 away from the substrate 110. Although not shown in the figures, in some optional embodiments, the display panel may further include an encapsulation layer covering the plurality of light-emitting elements PX, and a cover plate layer located at a side of the encapsulation layer away from the substrate 110.

Each of the light-emitting elements PX includes a first electrode 131, an organic light-emitting layer 132 and a second electrode 133, the first electrode 131 is located at a side of the organic light-emitting layer 132 facing the substrate 110, the second electrode 133 is located at a side of the organic light-emitting layer 132 away from the substrate 110, and the first electrode 131 of each of the light-emitting elements PX is electrically connected to a corresponding one of the pixel circuits PC.

One of the first electrode 131 and the second electrode 133 is an anode and the other is a cathode. Herein, for example, the first electrode 131 is an anode and the second electrode 133 is a cathode.

According to the color of light emitted by the organic light-emitting layer 132, the formed light-emitting elements PX may be classified into a variety of types. In an example, the light-emitting elements PX include a red light-emitting element, a green light-emitting element and a blue light-emitting element, although other examples are not limited thereto. According to the design requirements of the light-emitting elements PX, the light-emitting elements PX may further include at least one of a hole injection layer (HIL), a hole transporting layer (HTL), an electron injection layer (EIL) or an electron transporting layer (ETL) arranged between the first electrode 131 and the second electrode 133.

Figure 6:
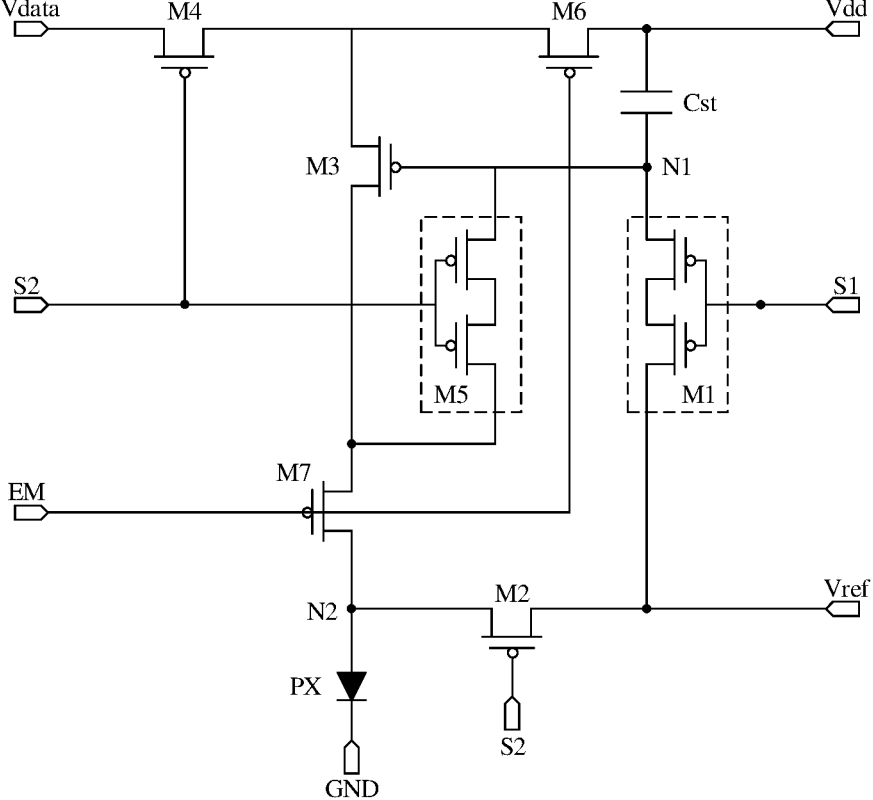
FIG. 6 shows an equivalent circuit diagram of a pixel circuit in a display panel according to a first embodiment of the present application.
Figure 7:
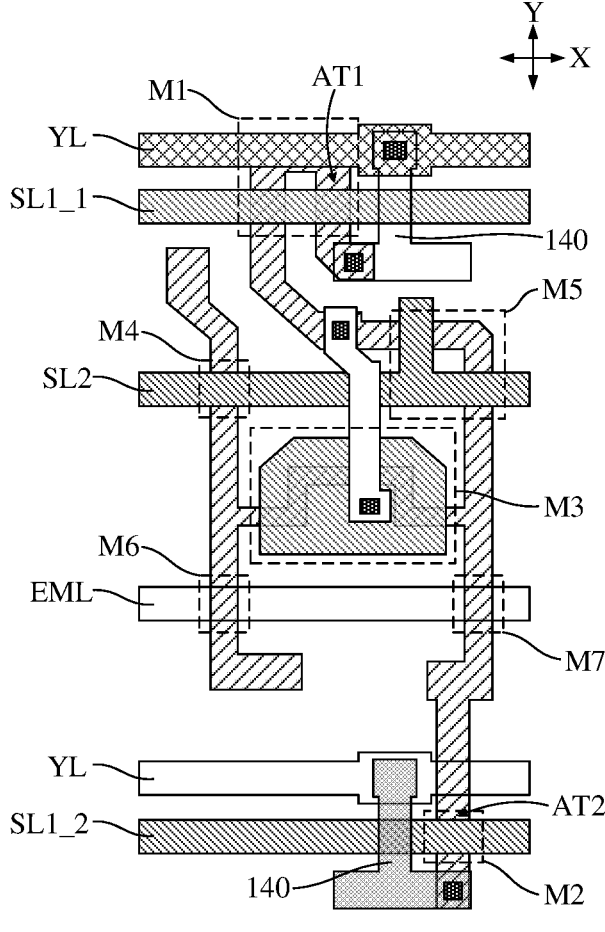
FIG. 7 shows a structural circuit diagram of a pixel circuit in a display panel according to a first embodiment of the present application.

FIG. 6 shows an equivalent circuit diagram of a pixel circuit in a display panel according to a first embodiment of the present application, and FIG. 7 shows a structural circuit diagram of a pixel circuit in a display panel according to a first embodiment of the present application. In the embodiment, the pixel circuit PC is a 7T1C circuit, that is, including seven transistors M1 to M7 and a storage capacitor Cst. Herein, the preset signal lines YL are reference voltage lines configured to provide a reference voltage signal Vref for resetting a preset node of the pixel circuits PC. For a row of the pixel circuits PC, a first scan line SL1_1 is configured to provide a first scan signal S1 and a second scan line SL2 is configured to provide a second scan signal S2, and the first scan line SL1_2 in the next row may be connected with the second scan line SL2 in this row, so as to provide the second scan signal S2 to this row and provide the first scan signal S1 to the next row of the pixel circuits PC. The light-emitting control line EML is configured to provide the light-emitting control signal EM. Although not shown in the figures, the display panel 100 may further include a data line for providing a data signal Vdata, and a power supply line for providing a power supply signal Vdd.

Referring to FIGS. 6 and 7, the plurality of transistors M1 to M7 in the pixel circuit PC include a driving transistor M3, a first resetting transistor M1 and a second resetting transistor M2. The driving transistor M3 is electrically connected to a corresponding light-emitting element PX to provide a drive current to the light-emitting element PX. The first resetting transistor M1 is electrically connected to a gate of the driving transistor M3 to reset the gate of the driving transistor M3. The second resetting transistor M2 is electrically connected to the first electrode 131 of the light-emitting element PX to reset the first electrode 131.

The semiconductor layer 121 of each of the pixel circuits PC includes a first active layer AT1 of the first resetting transistor M1 and a second active layer AT2 of the second resetting transistor M2.

Still referring to FIGS. 3 and 4, each of the preset signal lines YL extends between corresponding adjacent two rows of the pixel circuits PC, each of the preset signal lines YL is electrically connected to the first active layers AT1 of one row R1 of the adjacent two rows of the pixel circuits PC and is electrically connected to the second active layers AT2 of the other row R2 of the adjacent two rows of the pixel circuits PC.

As shown in FIG. 3, optionally, the display panel 100 further includes interconnecting structures 140 for electrically connecting the preset signal lines YL to the semiconductor layers 121 of corresponding adjacent two rows of the pixel circuits PC. The interconnecting structures 140 are located in a different layer from the semiconductor layers 121, and the interconnecting structures 140 and the semiconductor layers 121 are connected through vias.

The display panel 100 according to the above embodiments further includes the interconnecting structures 140 for electrically connecting the preset signal lines YL to the semiconductor layers 121 of corresponding adjacent two rows of the pixel circuits PC, so that each of preset signal lines YL can still provide the preset signal to the corresponding adjacent two rows of the pixel circuits PC, the brightness uniformity of the display panel 100 is improved without changing the configuration of the original driving timing signal, the cost for implementing the display panel 100 is reduced.

Optionally, the display panel 100 includes a plurality of conductive layers and a plurality of insulating layers arrange on the substrate 110, in which the interconnecting structures 140 are arranged in the conductive layers located at a side of the preset signal lines YL away from the substrate 110, and the interconnecting structures 140 and the preset signal lines YL are connected through vias. On the one hand, it has been proved that the interconnecting structures 140 arranged in the layers in which the preset signal lines YL are located and in the conductive layers located at a side of the preset signal lines YL away from the substrate 110 can significantly alleviate the regional characteristic difference of transistors, thereby significantly improving the display brightness uniformity. On the other hand, by arranging the interconnecting structures 140 in the conductive layers located at the side of the preset signal lines YL away from the substrate 110, the wiring pressure of the conductive layers in which the preset signal lines YL are located due to the arrangement of interconnecting structures 140 and the preset signal lines YL in a same layer can be alleviated, and the wiring rationality of the display panel 100 is improved.

As shown in FIG. 3, optionally, the interconnecting structures 140 are interconnecting blocks, each of the interconnecting blocks is connected to the semiconductor layers 121 of corresponding adjacent two of the pixel circuits PC in the second direction Y through a first via V1 and a second via V2, and each of the interconnecting blocks is connected to a corresponding preset signal line YL through a third via V3. In the embodiment, the interconnecting block is connected to the first node N1 through the first via V1 and connected to the second node N2 through the second via V2. In the embodiment, by arranging the interconnecting structures 140 to simultaneously provide the preset signal to the adjacent two of the pixel circuits PC in the second direction Y, the wiring structure of the interconnecting structures 140 is simplified to facilitate the arrangement of the interconnecting structures 140 in the conductive layers of the display panel 100.

Figure 8:
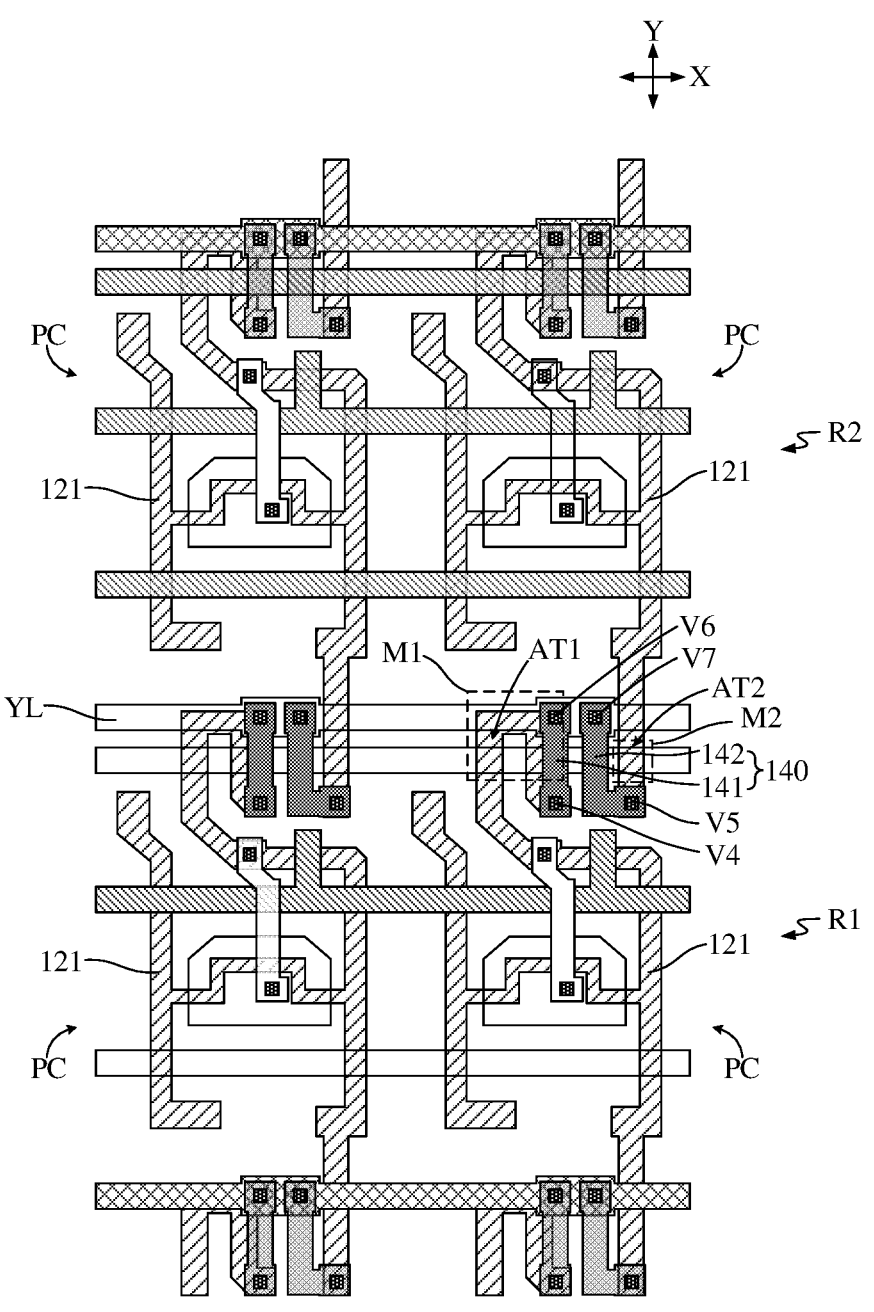
FIG. 8 shows a schematic structural diagram of a pixel circuit in a local area in a display panel according to a second embodiment of the present application.

The structure of the interconnecting structures 140 is not limited to the above examples and may be other suitable structures. FIG. 8 shows a schematic structural diagram of a pixel circuit in a local area in a display panel according to a second embodiment of the present application, a part of the structure of the display panel of the second embodiment is the same as that of the display panel 100 of the first embodiment, which will not be described in detail, and the differences will be described below.

In the second embodiment, the interconnecting structure 140 includes a first sub-interconnecting block 141 and a second sub-interconnecting block 142 spaced apart from each other. The first sub-interconnecting block 141 and the second sub-interconnecting block 142 electrically connect the semiconductor layers 121 of corresponding adjacent two of the pixel circuits PC in the second direction Y to a corresponding preset signal line YL, in which the first sub-interconnecting block 141 is connected to the semiconductor layer 121 of one of the adjacent two of the pixel circuits PC through a fourth via V4, the second sub-interconnecting block 142 is connected to the semiconductor layer 121 of the other of the adjacent two of the pixel circuits PC through a fifth via V5, the first sub-interconnecting block 141 is connected to the preset signal line YL through a sixth via V6, and the second sub-interconnecting block 142 is connected to the preset signal line YL through a seventh via V7. Specifically, the first sub-interconnecting block 141 is connected to the first active layer AT1 of one of the adjacent two of the pixel circuits PC through the fourth via V4, and the second sub-interconnecting block 142 is connected to the second active layer AT2 of the other of the adjacent two of the pixel circuits PC through the fifth via V5. In the embodiment, the semiconductor layers 121 of the pixel circuits PC that are spaced apart from each other are electrically connected to the preset signal line YL through independent sub-interconnecting blocks, the interference between the adjacent pixel circuits PC in the second direction Y is further reduced to ensures that the characteristics of the transistors of a same function in the pixel circuits PC are the same and that the display panel 100 has high display brightness uniformity.

The embodiments of the present application further provide a display apparatus which may include the display panel 100 according to any one of the above embodiments. The display panel 100 includes a display surface and a non-display surface opposite to each other. The display panel 100 includes a substrate 110 and a plurality of pixel circuits PC. The substrate 110 includes a first non-display area NA1 and a display area DA arranged around the first non-display area NA1. In some optional embodiments, the substrate 110 further includes a second non-display area NA2 arranged around the display area DA and the first non-display area NA1. Optionally, the display area DA of the display panel may be configured as an area that can display images, and the first non-display area NA1 may be configured as a light-transmitting area. In some embodiments, the display apparatus further includes a photosensitive component located at a side of the display panel 100 where the non-display surface is located and arranged correspondingly to the first non-display area NA1 of the display panel 100.

The photosensitive component may be an image capturing component for capturing external image information. In the embodiment, the photosensitive component is a complementary metal oxide semiconductor (CMOS) image capturing component, and in some other embodiments, the photosensitive component may be other image capturing components such as a charge-coupled device (CCD) image capturing component. It may be appreciated that the photosensitive component may not be limited to an image capturing component. For example, in some embodiments, the photosensitive component may be a light sensor such as an infrared sensor, a proximity sensor. Therefore, the photosensitive component includes at least one of an image capturing component, an infrared sensor or a proximity sensor.

According to the display apparatus of the embodiments of the present application, the photosensitive component may be integrated at a side of the display panel 100 where the non-display surface of the first non-display area NA1 is located, and the first non-display area NA1 is configured as a light-transmitting area, so that the display apparatus can perform photosensitive functional operations such as image capturing in the first non-display area NA1.

According to the display apparatus of the embodiments of the present application, the plurality of pixel circuits PC are arranged in a plurality of rows in the display area DA, and each row of the pixel circuits PC includes a plurality of pixel circuits PC arranged in the first direction X. The plurality of rows of the pixel circuits PC are arranged along the second direction Y. The second direction Y intersects the first direction X. The semiconductor layers 121 of the adjacent pixel circuits PC are spaced apart from each other, that is, the semiconductor layers 121 of the adjacent pixel circuits PC are not only disconnected from each other in a first direction X, but also disconnected from each other in a second direction Y. In the display apparatus of the embodiments of the present application, the lengths of the semiconductor layers 121 to which the pixel circuits PC are connected tend to be the same. Therefore, the regional characteristic difference of transistors caused by the length difference of the semiconductor layers 121 is reduced, the characteristics of the transistors of a same function in the pixel circuits PC in the display area DA tend to be the same, the brightness uniformity of the displayed image in the display area DA is improved, and the possibility of uneven display brightness is reduced.

The above embodiments of the present application do not exhaustively describe all the details, nor do they limit the present application to merely the specific embodiments described. Obviously, according to the above description, many modifications and changes can be made. These embodiments are selected and specifically described in the specification to better explain the principles and practical applications of the present application, so that those skilled in the art are able to make good use of the present application and make modifications on the basis of the present application. The present application is only defined by the claims and their full scope and equivalents.

What is claimed is:

1. A display panel, comprising:
a substrate comprising a first non-display area and a display area arranged around the first non-display area;
a plurality of pixel circuits arranged in a plurality of rows extending along a first direction and a plurality of columns extending along a second direction in the display area, the first direction and the second direction intersecting each other, and each of the pixel circuits comprising a semiconductor layer for forming an active layer of a transistor, wherein the semiconductor layers of adjacent ones of the pixel circuits in the second direction are spaced apart from each other;
a plurality of light-emitting elements arranged in the display area, each of the light-emitting elements comprising a first electrode, an organic light-emitting layer, and a second electrode; and
a plurality of scan lines extending along the first direction;
wherein each of the pixel circuits comprises a driving transistor, a first resetting transistor and a second resetting transistor, the driving transistor is electrically connected to a corresponding light-emitting element to provide a drive current to the light-emitting element, the first resetting transistor is electrically connected to a gate of the driving transistor to reset the gate of the driving transistor, and the second resetting transistor is electrically connected to the first electrode of the light-emitting element to reset the first electrode;

the semiconductor layer of each of the pixel circuits comprises an active layer of the driving transistor, a first active layer of the first resetting transistor and a second active layer of the second resetting transistor, wherein, in the same pixel circuit, the first active layer of the first resetting transistor and the second active layer of the second resetting transistor are located on opposite sides of the driving transistor along the second direction, the active layer of the driving transistor is connected to a first terminal of the second active layer of the second resetting transistor, and the active layer of the driving transistor is connected to a first terminal of the first active layer of the first resetting transistor, in two pixel circuits adjacent along the second direction, the first active layer of the first resetting transistor in one pixel circuit and the second active layer of the second resetting transistor in the other pixel circuit are spaced apart from each other and arranged along the first direction, a second terminal of the first active layer of the first resetting transistor in one pixel circuit and a second terminal of the second active layer of the second resetting transistor in the other pixel circuit are spaced apart from each other and arranged along the first direction to form a gap.

2. The display panel of claim 1, further comprising:

a plurality of preset signal lines extending along the first direction, each of the preset signal lines being electrically connected to the semiconductor layers of corresponding adjacent two rows of the pixel circuits to simultaneously provide a preset signal to the adjacent two rows of the pixel circuits.

3. The display panel of claim 2, wherein in the adjacent two rows of the pixel circuits electrically connected to the preset signal line, the semiconductor layers of one of the adjacent two rows of the pixel circuits comprise a first node to which the preset signal line is electrically connected, the semiconductor layers of the other of the adjacent two rows of the pixel circuits comprise a second node to which the preset signal line is electrically connected, and the semiconductor layers of adjacent ones of the pixel circuits are spaced apart from each other between the first node and the second node.

4. The display panel of claim 1, further comprising:

a plurality of preset signal lines extending along the first direction, wherein the preset signal lines are reference voltage lines configured to provide a reference voltage signal for resetting a preset node of the pixel circuits.

5. The display panel of claim 1, wherein the first electrode being located at a side of the organic light-emitting layer facing the substrate, the second electrode being located at a side of the organic light-emitting layer away from the substrate, and the first electrode of each of the light-emitting elements being electrically connected to a corresponding one of the pixel circuits, and the light-emitting element further comprises at least one of a hole injection layer, a hole transporting layer, an electron injection layer or an electron transporting layer arranged between the first electrode and the second electrode.

6. The display panel of claim 4, wherein each of the preset signal lines extends between corresponding adjacent two rows of the pixel circuits, each of the preset signal lines is electrically connected to the first active layers of one of the adjacent two rows of the pixel circuits and is electrically connected to the second active layers of the other of the adjacent two rows of the pixel circuits.

7. The display panel of claim 4, further comprising:

interconnecting structures for electrically connecting the preset signal lines to the semiconductor layers of corresponding adjacent two rows of the pixel circuits, the interconnecting structures being located in a different layer from the semiconductor layers, and the interconnecting structures and the semiconductor layers being connected through vias.

8. The display panel of claim 7, wherein the display panel comprises a plurality of conductive layers and a plurality of insulating layers arranged on the substrate, wherein the interconnecting structures are arranged in the conductive layers located at a side of the preset signal lines away from the substrate, and the interconnecting structures and the preset signal lines are connected through vias.

9. The display panel of claim 7, wherein the interconnecting structures are interconnecting blocks, each of the interconnecting blocks is connected to the semiconductor layers of corresponding adjacent two of the pixel circuits in the second direction through a first via and a second via, and each of the interconnecting blocks is connected to a corresponding preset signal line through a third via.

10. The display panel of claim 7, wherein each of the interconnecting structures comprises a first sub-interconnecting block and a second sub-interconnecting block spaced apart from each other, the first sub-interconnecting block and the second sub-interconnecting block electrically connect the semiconductor layers of corresponding adjacent two of the pixel circuits in the second direction to a corresponding preset signal line, wherein the first sub-interconnecting block is connected to the semiconductor layer of one of the adjacent two of the pixel circuits through a fourth via, the second sub-interconnecting block is connected to the semiconductor layer of the other of the adjacent two of the pixel circuits through a fifth via, the first sub-interconnecting block is connected to the preset signal line through a sixth via, and the second sub-interconnecting block is connected to the preset signal line through a seventh via.

11. The display panel of claim 5, further comprising:

an encapsulation layer covering the plurality of light-emitting elements; and a cover plate layer located at a side of the encapsulation layer away from the substrate, wherein the display area comprises a first boundary and a second boundary opposite to each other in the second direction, and a spacing between the first non-display area and the first boundary is not equal to a spacing between the first non-display area and the second boundary.

12. The display panel of claim 1, wherein the semiconductor layer is a silicon semiconductor layer or an oxide semiconductor layer.

13. A display apparatus comprising the display panel of claim 1, wherein the first non-display area is configured as a light-transmitting area.

14. The display apparatus of claim 13, wherein the display panel comprises a display surface and a non-display surface opposite to each other, the display apparatus further comprises:

a photosensitive component, located at a side of the display panel where the non-display surface is located, and arranged correspondingly to the first non-display area of the display panel, wherein the photosensitive component comprises at least one of an image capturing component, an infrared sensor, or a proximity sensor.

15. The display panel of claim 1, wherein in the two pixel circuits adjacent along the second direction, the first active layer of the first resetting transistor in one pixel circuit and located on a side of the one pixel circuit close to the other pixel circuit, and the second active layer of the second resetting transistor in the other pixel circuit and located on a side of the other pixel circuit close to the one pixel circuit, are spaced apart from each other, the second terminal of the first active layer of the first resetting transistor in the one pixel circuit and located on the side of the one pixel circuit close to the other pixel circuit, and the second terminal of the second active layer of the second resetting transistor in the other pixel circuit and located on the side of the other pixel circuit close to the one pixel circuit, are spaced apart from each other and arranged along the first direction to form the gap.

16. The display panel of claim 1, wherein, in the two pixel circuits adjacent along the second direction, a projection of the first active layer of the first resetting transistor in one pixel circuit on the substrate and a projection of the second active layer of the second resetting transistor in the other pixel circuit on the substrate are spaced apart from each other, and overlap with a projection of the same scan line on the substrate.

17. The display panel of claim 1, wherein the semiconductor layers of adjacent ones of the pixel circuits in the first direction are spaced apart from each other.

18. The display panel of claim 1, further comprising:
a plurality of light-emitting control lines extending along the first direction, wherein each of the pixel circuits further comprises a third transistor,
the semiconductor layer of each of the pixel circuits further comprises an active layer of the third transistor;
in the same pixel circuit, the active layer of the driving transistor is connected to the first terminal of the second active layer of the second resetting transistor by the active layer of the third transistor,
a projection of the active layer of the third transistor on the substrate overlaps with a projection of the light-emitting control line on the substrate.

19. The display panel of claim 18, wherein each pixel circuit further comprises a fourth transistor, and the semiconductor layer of each pixel circuit further comprises an active layer of the fourth transistor;
in the same pixel circuit, the active layer of the driving transistor is connected to the first terminal of the first active layer of the first resetting transistor by the active layer of the fourth transistor.

20. The display panel of claim 1, wherein the plurality of scan lines comprises a plurality of first scan lines extending along the first direction,
in the two pixel circuits adjacent along the second direction, a projection of the first active layer of the first resetting transistor in one pixel circuit on the substrate and a projection of the second active layer of the second resetting transistor in the other pixel circuit on the substrate overlap with a projection of a same first scan line on the substrate; projections of the second terminal of the first active layer of the first resetting transistor in one pixel circuit and the second terminal of the second active layer of the second resetting transistor in the other pixel circuit on the substrate are located on the same side of the projection of the same first scan line on the substrate, and spaced apart from each other and arranged along the first direction to form the gap; projections of the first terminal and the second terminal of the second active layer of the second resetting transistor in the other pixel circuit on the substrate are located on opposite sides of the projection of the same first scan line on the substrate.

* * * * *